(12) United States Patent
Zhang et al.

(10) Patent No.: US 11,244,735 B2
(45) Date of Patent: Feb. 8, 2022

(54) SYSTEMS AND METHODS FOR PROGRAM VERIFICATION ON A MEMORY SYSTEM

(71) Applicant: SanDisk Technologies LLC, Addison, TX (US)

(72) Inventors: Zhiping Zhang, San Jose, CA (US); Huai-Yuan Tseng, San Jose, CA (US); Dengtao Zhao, San Jose, CA (US); Deepanshu Dutta, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 85 days.

(21) Appl. No.: 16/793,749

(22) Filed: Feb. 18, 2020

(65) Prior Publication Data
US 2021/0257037 A1    Aug. 19, 2021

(51) Int. Cl.
| | |
|---|---|
| *G11C 16/34* | (2006.01) |
| *G11C 16/12* | (2006.01) |
| *G11C 11/56* | (2006.01) |
| *G11C 16/26* | (2006.01) |

(52) U.S. Cl.
CPC ...... *G11C 16/3459* (2013.01); *G11C 11/5628* (2013.01); *G11C 16/12* (2013.01); *G11C 16/26* (2013.01); *G11C 2211/5641* (2013.01)

(58) Field of Classification Search
CPC . G11C 16/3459; G11C 11/5628; G11C 16/12; G11C 16/02; G11C 2211/5641

USPC ........... 365/185.22, 185.17, 185.18, 185.21, 365/185.23
See application file for complete search history.

(56) References Cited

U.S. PATENT DOCUMENTS

| | | | |
|---|---|---|---|
| 10,629,271 B2* | 4/2020 | Zhao | G11C 16/04 |
| 2006/0146610 A1 | 7/2006 | Takeuchi et al. | |
| 2013/0301360 A1* | 11/2013 | Winter | G11C 16/3459 365/185.22 |
| 2016/0099063 A1* | 4/2016 | Shim | G11C 16/3459 365/185.19 |

FOREIGN PATENT DOCUMENTS

| | | |
|---|---|---|
| JP | 2001250395 A | 9/2001 |
| KR | 20120030281 A | 3/2012 |

* cited by examiner

*Primary Examiner* — Connie C Yoha
(74) *Attorney, Agent, or Firm* — Dickinson Wright PLLC; Steven Hurles

(57) ABSTRACT

A method for memory program verification includes performing a write operation on memory cells of a memory device. The method also includes identifying memory strings associated with respective memory cells of the memory cells. The method also includes identifying a first memory string of the memory strings. The method also includes disabling a portion of a write verification for the first memory string. The method also includes enabling the portion of the write verification for other memory strings of the memory strings. The method also includes performing at least the portion of the write verification operation on write verification enabled memory strings.

20 Claims, 11 Drawing Sheets

SYSTEMS AND METHODS FOR PROGRAM VERIFICATION ON A MEMORY SYSTEM

TECHNICAL FIELD

This disclosure relates to memory systems and in particular to systems and methods for performing program verification on a memory system.

BACKGROUND

Non-volatile memory systems are a type of memory that retains stored information without requiring an external power source. Examples of non-volatile memory systems include flash memory, such as NAND flash or NOR flash. NAND flash memory structures typically arrange multiple memory cell transistors (e.g., floating-gate transistors or charge trap transistors) in series with and between two select gates (e.g., a drain-side select gate and a source-side select gate). The memory cell transistors in series and the select gates may be referred to as a NAND string. NAND flash memory may be scaled in order to reduce cost per bit.

Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased. Additionally, data programmed to such non-volatile memory during performance of a program operation may be verified by performing a verification operation using a read verification voltage. Typically, the verification operation equalizes channel potential of the non-volatile memory.

SUMMARY

This disclosure relates generally to memory management systems and methods.

An aspect of the disclosed embodiments includes a method for memory program verification. The method includes performing a write operation on memory cells of a memory device. The method also includes identifying memory strings associated with respective memory cells of the memory cells. The method also includes identifying a first memory string of the memory strings. The method also includes disabling a portion of a write verification for the first memory string. The method also includes enabling the portion of the write verification for other memory strings of the memory strings. The method also includes performing at least the portion of the write verification operation on write verification enabled memory strings.

Another aspect of the disclosed embodiments includes a controller that includes a bus interface and a processor. The bus interface is in communication with at least one memory block of a memory device. The processor is configured to: perform a write operation on memory cells of the at least one memory block; identify memory strings associated with respective memory cells of the memory cells; identify a first memory string of the memory strings; disable a portion of a write verification for the first memory string; enable the portion of the write verification for other memory strings of the memory strings; and perform at least the portion of the write verification operation on write verification enabled memory strings.

Another aspect of the disclosed embodiments includes a method for memory program verification. The method includes performing a write operation on memory cells of a memory device. The method also includes identifying memory strings associated with respective memory cells of the memory cells. The method also includes identifying a first memory string of the memory strings, the first memory string including a memory string of the memory strings to be programmed first during performance of the write operation. The method also includes, in response to completion of performance of the write operation on the first memory string, skipping performance of a portion of a write verification operation on the first memory string. The method also includes performing, in response to completion of performance of the write operation on subsequently programmed memory strings, at least the portion of the write verification operation on the respective subsequently programmed memory strings of the memory strings.

These and other aspects of the present disclosure are disclosed in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1A:
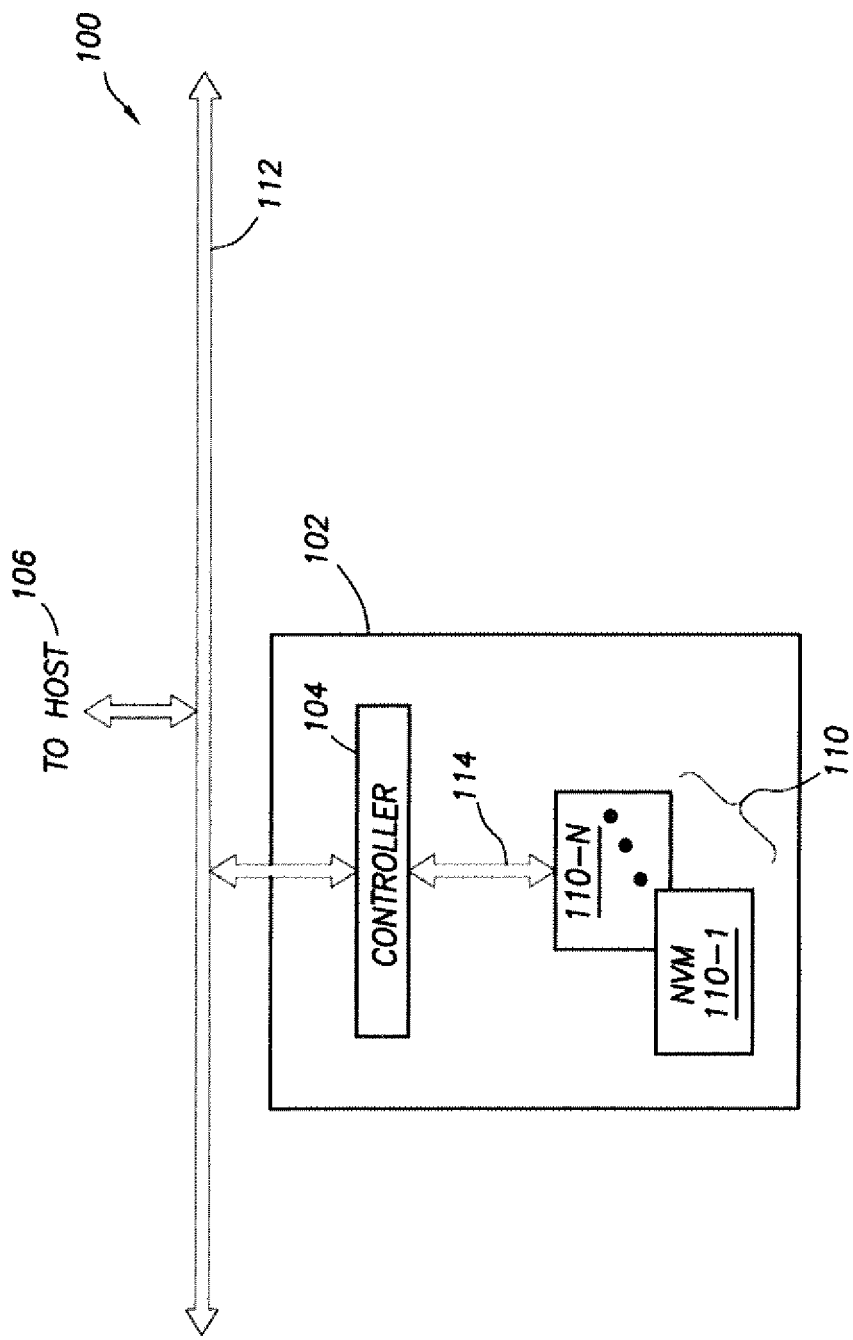
FIGS. 1A-1B generally illustrates a block diagram of an example non-volatile memory system according to the principles of the present disclosure.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, non-volatile memory systems are a type of memory that retains stored information without requiring an external power source. Examples of non-volatile memory systems include flash memory, such as NAND flash or NOR flash. NAND flash memory structures typically arrange multiple memory cell transistors (e.g., floating-gate transistors or charge trap transistors) in series with and between two select gates (e.g., a drain-side select gate and a source-side select gate). The memory cell transistors in series and the select gates may be referred to as a NAND string. NAND flash memory may be scaled in order to reduce cost per bit.

Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased.

During performance of a program operation (e.g., a write operation) data is written (e.g., stored) in memory cells of the non-volatile memory. After data is written to a memory cell, the data in the memory cell may be verified. For example, a controller associated with the non-volatile memory may perform a program or write verification operation, which may include applying a read verification voltage to memory strings comprising the programmed memory cells and one or more other write verification operations or steps. The application of the read verification voltage may result in a verification voltage (e.g., causing the verification voltage spike) in the corresponding memory strings. This may equalize the channel potential for the non-volatile memory regardless of a state of the various memory cells of the non-volatile memory, which avoid the need for source-side injection.

Performance of the portion of the verification operation that includes applying the read verification voltage may add a relatively significant amount of time to the entire program operation. For example, a typical program loop may be ~20 microseconds and the portion of the verification operation, after a respective program loop, may be an additional ~10 microseconds to each program loop. Further, the time for performing the portion of the verification operation may increase for non-volatile memory including multiple level cells, triple level cells, quad level cells, and so on.

In addition to the time required to perform the program operation (e.g., the time for programming during each program loop and for performing the verification operation), timing parameters of the verification operation may require particular care in tuning. For example, if a ramp down time is insufficient, a relatively lower state verify voltage level may be higher than expected. This may result in an over-program of respective memory cells and voltage widening.

Typically, in order to address the amount of time added to the program operation from the verification operation, the verification operation may be disabled on the non-volatile memory. For example, during performance of the program operation, the controller does not perform the verification operation (e.g., does not apply the read verification voltage and the data programmed to the memory cells is not verified). However, this may not change other voltage biases or other related clocks (e.g., referred to as R2 and R3).

Figure 4A:
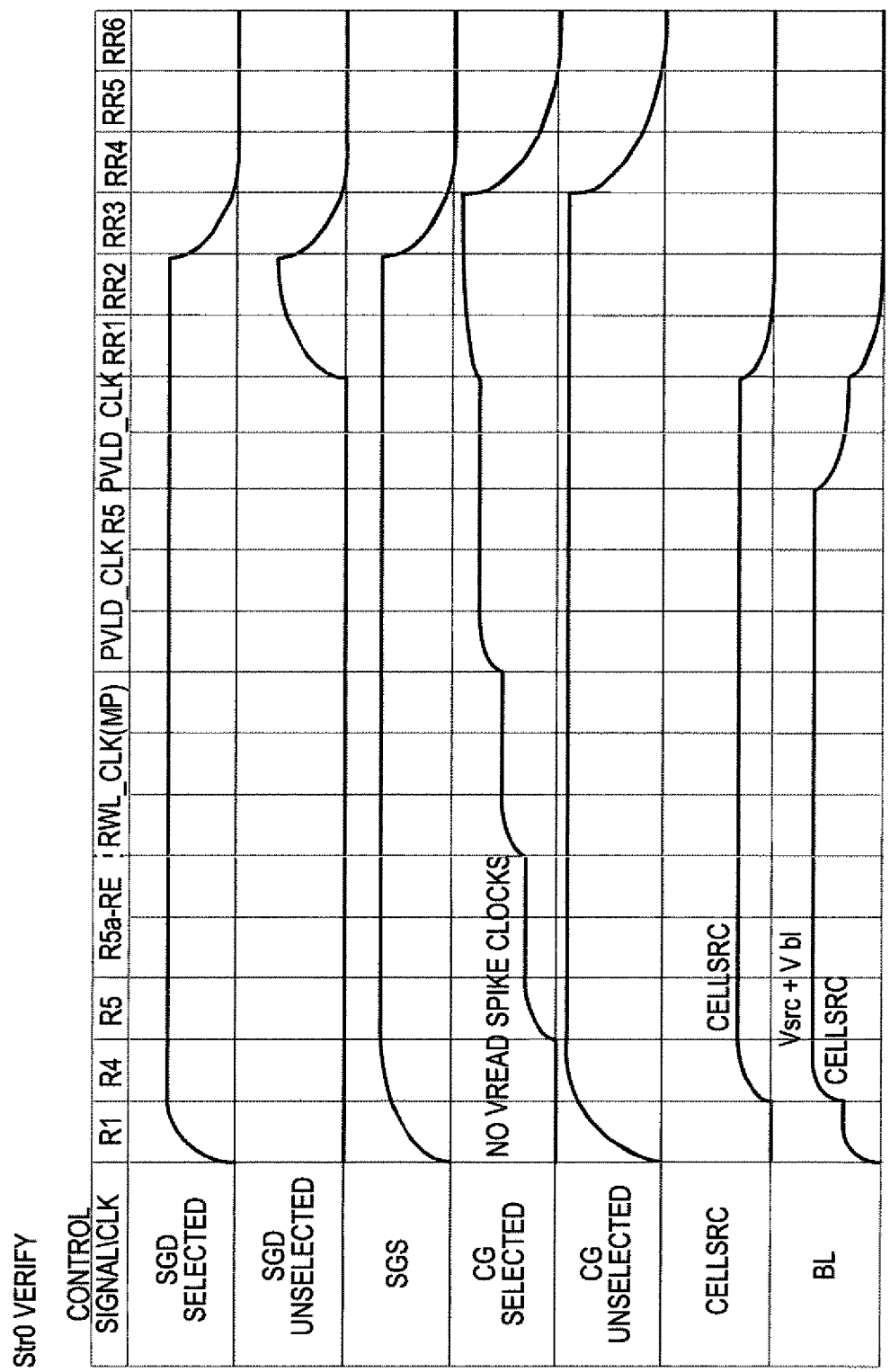
FIGS. 4A and 4B generally illustrate memory string verification voltage charts according to the principles of the present disclosure.
Figure 4B:
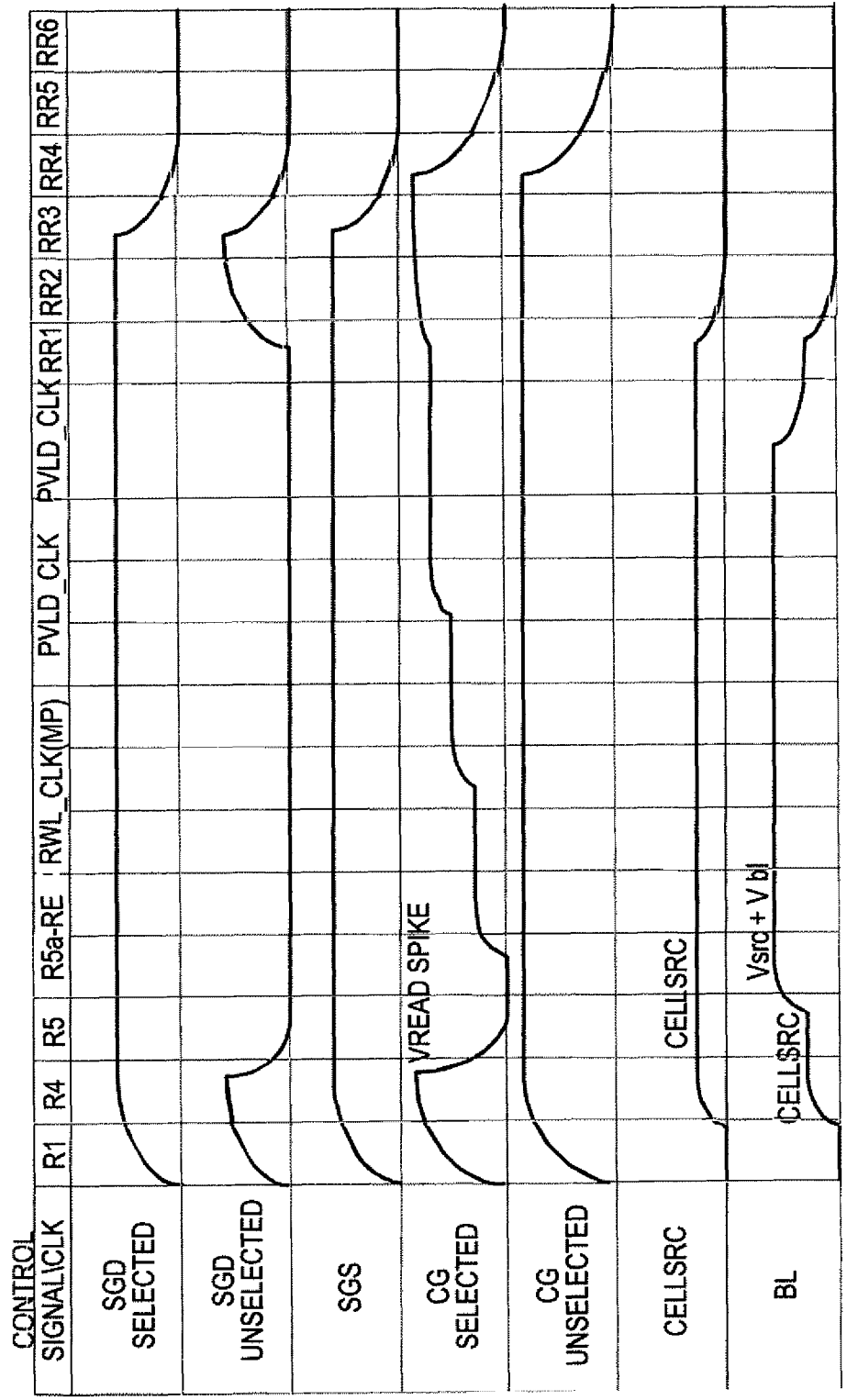

Accordingly, systems and methods, such as those described herein, configured to reduce program operation time while performing the verification operation, may be desirable. In some embodiments, the systems and methods described herein may be configured to perform a fast verification operation by skipping the application of the read verification voltage on a first memory string programmed during performance of a program operation (e.g., Str0 or any other suitable memory string) to improve write performance. FIGS. 4A and 4B generally illustrate plots of simplified waveforms of the verification operation in two cases: Str0 (e.g., the first memory string programmed during performance of the program operation), as is generally illustrated in FIG. 4A; and subsequent or other memory strings programmed during performance of the program operation, as is generally illustrated in FIG. 4B.

In some embodiments, the systems and methods described herein may be configured to perform a write operation on memory cells of a memory device. The systems and methods described herein may be configured to identify memory strings associated with respective memory cells of the memory cells. The systems and methods described herein may be configured to identify a first memory string of the memory strings. The systems and methods described herein may be configured to disable a portion of a write verification for the first memory string. The systems and methods described herein may be configured to enable the portion of the write verification for other memory strings of the memory strings. The systems and methods described herein may be configured to perform at least the portion of the write verification operation on write verification enabled memory strings.

In some embodiments, the systems and methods described herein may be configured to perform a write operation on memory cells of a memory device. The systems and methods described herein may be configured to identify memory strings associated with respective memory cells of the memory cells. The systems and methods described herein may be configured to identify a first memory string of the memory strings, the first memory string including a memory string of the memory strings to be programmed first during performance of the write operation. The systems and methods described herein may be configured to, in response to completion of performance of the write operation on the first memory string, skip performance of a portion of a write verification operation on the first memory string. The systems and methods described herein may be configured to perform, in response to completion of performance of the write operation on subsequently programmed memory strings, the portion of the write verification operation on the respective subsequently programmed memory strings of the memory strings.

In some embodiments, the systems and methods described herein may be configured to reduce or eliminate program clocks (e.g., referred to as R1, R2, and R3 and generally illustrated in FIGS. 4A and 4B). The systems and methods described herein may be configured to replace the program clocks with a relatively shorter clock (e.g., referred to as R1) for the first memory string during performance of the verification operation (e.g., saving ~10 microseconds for each program look performed during performance of the program operation). The systems and methods described herein may be configured to provide a fast verification operation for non-volatile memory comprising single level cells (SLC), multiple level cells (MLC), triple level cells (TLC), quad-level cells (QLC), and so on.

FIG. 1A illustrates a block diagram of an example system architecture 100 including non-volatile memory. In particular, the example system architecture 100 includes storage system 102 (e.g., which may be referred to as a memory system), a controller 104, and a host 106. In various embodiments, the host 106 can include any device or system that utilizes the storage system 102. In some embodiments, various aspects of the controller 104 may be implemented by the host 106 or the host 106 can include its own controller (e.g., a processor) configured to execute instructions stored in the storage system 102 and further the host 106 can access data stored in the storage system 102.

Examples of the host 106 include computing devices such as a desktop computer, rack mounted server, a laptop, a smartphone, a tablet, or other suitable computing devices. Host 106 can also include systems and devices such as a gaming system, a digital phone, a digital camera (e.g., digital still cameras and digital movie cameras), portable media player, digital photo frame, remote control, television stick, smart television, and the like. Furthermore, the system architecture 100 can be implemented in a memory card such as secure digital (SD) card or a micro secure digital (micro-SD) card. In some embodiments, the system architecture 100 is embedded in the host, for example as a solid-state disk (SSD) drive installed in a laptop computer.

In embodiments where the system architecture 100 is implemented within a memory card, the host 106 can include a built-in receptacle for one or more types of memory cards or flash drives (e.g., a universal serial bus (USB) port, or a memory card slot). Additionally, or alternatively, the host 106 can include adapters into which a memory card may be plugged. The foregoing examples of a host are not meant to be limiting examples. On the contrary, a host 106 can include any type of device, system, and apparatus that accesses the storage system 102.

In FIG. 1A, the storage system 102 includes a memory controller and drivers (e.g., controller 104)—as will be described further below—however, in some embodiments of the storage system 102, the storage system 102 may include memory-only units that are instead controlled by software executed by a controller on the host 106 (e.g., a processor of a computing device controls, including error handling of, the storage system 102). Furthermore, although FIG. 1A illustrates the storage system 102 as separate from the host 106, in some embodiments, the storage system 102 is embedded with the host 106, where the memory, controller, and drivers are formed on a single integrated circuit chip.

The host 106 can communicate with the storage system 102 using of a bus 112 that implements any known or after developed communication protocol that enables the storage system 102 and the host 106 to communicate. The communication protocol may include Secure Digital (SD) protocol, Memory stick (MS) protocol, USB protocol, Advanced Microcontroller Bus Architecture (AMBA), or other suitable communication protocol.

In various embodiments, the controller 104 acts as an interface between the host 106 and the storage system 102. The host 106 may communicate with the controller 104 via a bus interface associated with the bus 112. The controller 104 can include individual circuit components, processing circuitry (e.g., logic gates and switches), a processor, a microprocessor, a microcontroller with controlling software, or a field programmable gate array (FPGA). Furthermore, the example controller 104 includes a computer-readable medium that stores computer-readable program code (e.g., software or firmware) executable by the processor. In some embodiments, the controller 104 is a flash memory controller. In some embodiments, the controller 104 is a processor executing within the host 106.

Still referring to FIG. 1A, according to some embodiments, the controller 104 acts as an interface between the host 106 and the storage system 102 and manages data stored on the storage system 102. For example, the host 106 can access data stored in the storage system 102 by providing a logical address, via the bus interface associated with the bus 112, to the controller 104, which, the controller 104 converts to a physical address. The controller 104 can access data and/or a particular storage location associated with the physical address and facilitate transferring data between the storage system 102 and the host 106. In some embodiments, where the storage system 102 includes flash memory, the controller 104 formats the flash memory to ensure the memory is operating properly, maps out bad flash memory cells, and allocates spare cells to be substituted for future failed cells or used to hold firmware to operate the flash memory controller (e.g., the controller 104).

Accordingly, the controller 104 performs various memory management functions such as wear leveling (e.g., distributing writes to extend the lifetime of the memory blocks), garbage collection (e.g., moving valid pages of data to a new block and erasing the previously used block), and error detection and correction (e.g., read error handling).

Still referring to FIG. 1A, the storage system 102 includes the non-volatile memory (NVM) block 110 which may include several memory die 110-1-110-N. In some embodiments, the NVM block 110 defines a physical set of memory die, such as the memory die 110-1-110-N. In other embodiments, the NVM block 110 defines a logical set of memory die, where the NVM block 110 includes memory die from several physically different sets of memory die. The manner in which the NVM block 110 is defined in FIG. 1A is not meant to be limiting.

Each memory die, for example memory die 110-1, includes non-volatile memory cells, such as NAND flash memory cells, NOR flash memory cells, or other suitable memory cells. As the memory cells are non-volatile, the memory cells in the storage system 102 retain data even when there is an interruption in power supplied to the memory cells and/or the storage system 102. Thus, the storage system 102 can be easily transported and the storage system 102 can be used in memory cards and other memory devices that are not always connected to a power supply.

In various embodiments, the memory cells in the memory die 110 are solid-state memory cells (e.g., flash) and are one-time programmable, few-time programmable, or many time programmable. Additionally, the memory cells in the memory die 110 can include single-level cells (SLC), multiple-level cells (MLC), or triple-level cells (TLC). In some embodiments, the memory cells are fabricated in a planar manner (e.g., 2D NAND (NOT-AND) flash) or in a stacked or layered manner (e.g., 3D NAND flash). That is, planar flash memory includes a single layer of memory cell, while stacked flash memory includes memory cells that are stacked vertically in multiple layers (e.g., referred to as planes).

In some embodiments, and as shown in FIG. 1A, the controller 104 and the NVM block 110 are communicatively coupled by an interface 114 that implements any known or after developed communication protocol. In embodiments where the storage system 102 is flash memory, the interface 114 is a flash interface, such as Toggle Mode 200, 400, 800, or Common Flash Memory Interface (CFI). In various embodiments, the interface 114 can be implemented by several channels (e.g., physical connections) disposed between the controller 104 and the individual memory die 110-1-110-N. Furthermore, the number of channels over which the interface 114 is established varies based on the capabilities of the controller 104. Additionally, a single channel can be configured to communicatively couple more than one memory die. The depiction of a single interface 114 is not meant to be limiting. To the contrary, the single interface is representative of an example interface that can be used between components, and one or more interfaces can be used to communicatively couple the same components.

Figure 1B:
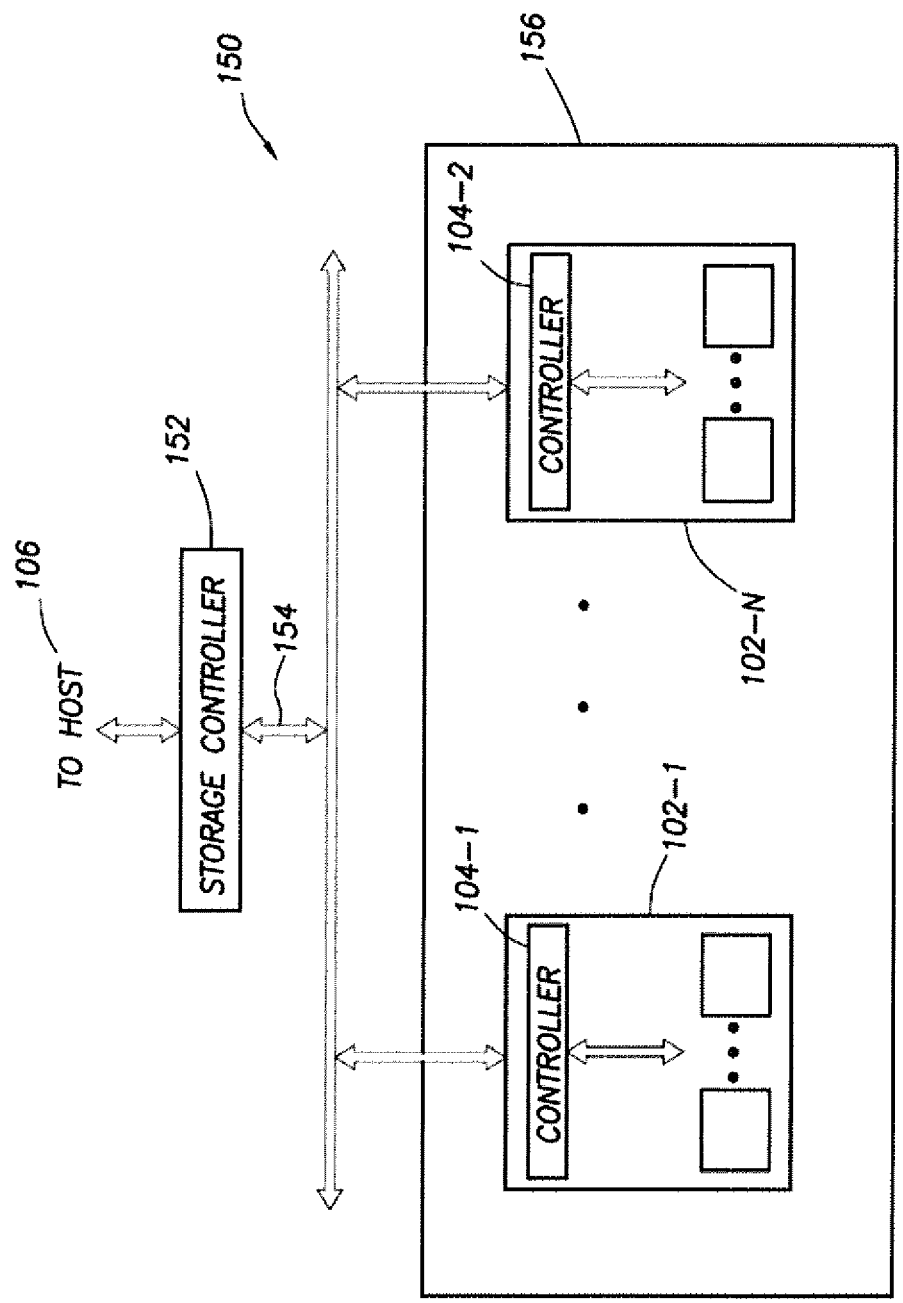

FIG. 1B generally illustrates a block diagram of a system architecture 100 according to the principles of the present disclosure. The system architecture 100 can be implemented as part of a larger system architecture. For example, as shown in FIG. 1B, the system architecture 150 includes a storage module 156 that further includes several storage systems 102. Within the example system architecture 150, the storage module 156 is communicatively coupled with the host 106 by way of a storage controller 152. In particular, an interface 154 between the host 106 and the storage module 156 includes a bus interface that implements any known or after developed communication protocol, such as a serial advanced technology attachment (SATA) or peripheral component interface express (PCIe) interface. In some embodiments, the storage module 156 is an SSD (e.g., in a laptop computer or a tablet).

Some implementations of the system architecture 100 include a hierarchical storage system. A hierarchical storage system can include a plurality of storage controllers 152, each of which control a respective storage system 102. Furthermore, a plurality of hosts 106 can each access the hierarchical storage system. Hosts 106 can access memories within the hierarchical storage system via a bus interface that implements any known or after developed communication protocol including a non-volatile memory express (NVMe) or a fiber channel over Ethernet (FCoE) interface. The hierarchical storage system can be implemented as a rack mounted storage system that is accessible by multiple host computers (e.g., a data center).

The interface 154 can be implemented by several channels (e.g., physical connections) disposed between the storage controller 152 and the storage module 156. In some embodiments, the number of channels over which an interface 154 is established varies based on the capabilities of the storage controller 152. The depiction of a single interface is not meant to be limiting and the single interface is representative of an example interface that can be used between components, where one or more interfaces can be used to communicatively couple various components.

Figure 2A:
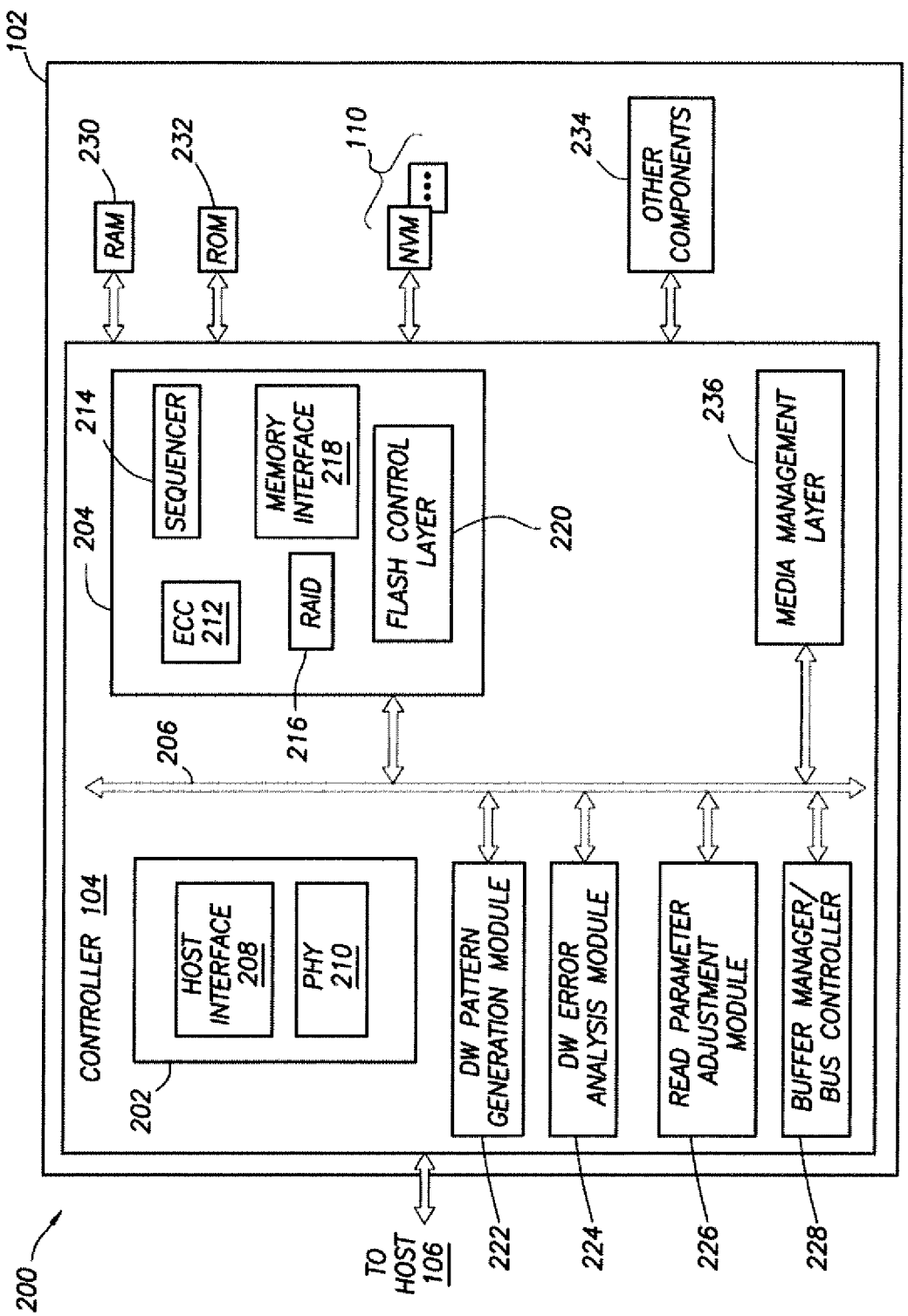
FIG. 2A generally illustrates a block diagram of example components of a controller according to the principles of the present disclosure.

FIG. 2A generally illustrates a block diagram 200 of the storage system 102, according to the principles of the present disclosure. The block diagram 200 of the storage system 102 includes components previously described in FIG. 1A, such as the controller 104 and the NVM memory block 110. Additional components that can be present within the storage system 102 include a random access memory (RAM) 230, a read only memory (ROM) 232, and other components 234. In some embodiments, the ROM 232 stores system boot code.

Although the RAM 230 and the ROM 232 are shown as separate modules within the storage system 102, the illustrated architecture is not meant to be limiting. For example, the RAM 230 and the ROM 232 can be located within the controller 104. In some embodiments, portions of the RAM 230 or ROM 232, respectively, are located outside the controller 104 and within the controller 104. In other embodiments, the controller 104, the RAM 230, and the ROM 232 can be located on separate semiconductor die. In various embodiments, the other components 234 include external electrical interfaces, external RAM, resistors, capacitors, logic gates, or other components that interface with the controller 104.

In some embodiments, the controller 104 includes a module 202 that interfaces with the host 106, a module 204 that interfaces with the NVM memory block 110, as well as various other modules, described further below. The modules within the controller (e.g., modules 202 and 204) are communicatively coupled to each other by a bus 206.

The following discussion of the various modules depicted within the controller 104 are meant to be illustrative and not limiting. For example, the various modules generally illustrated in FIG. 2A are not limited to being executed within the controller 104, and in some embodiments, one or more modules can be executed outside the controller 104.

The module 202 interfaces with the host 106 and includes a host interface 208 and a physical layer interface 210 that provides the electrical interface between the host 106 or next level storage controller and the controller 104. The host interface 208 facilitates transferring of data, control signals, and timing signals. Examples of the host interface 208 include SATA, SATA express, Serial Attached SCSI (SAS), Fibre Channel, USB, PCIe, and NVMe.

Still referring to FIG. 2A, in various embodiments, the module 204 is configured to communicate with the NVM block 110 and includes an error correcting code (ECC) engine 212. In some embodiments, the ECC engine 212 encodes data received from the host 106 and stores the encoded data in the NVM block 110. When the data is read out from the NVM memory block 110, the ECC engine 212 decodes the data and corrects errors detected within the data To detect errors, the ECC engine 212 implements various types of error checking using algorithms such as low-density parity-check (LDPC) code, Bose-Chaudhuri-Hocquenghem (BCH) code, a soft read, and/or extra parity.

The example module 204 also includes a sequencer 214 and a Redundant Array of Independent Drives (RAID) module 216. In various embodiments, the sequencer 214 generates command sequences, such as program and erase command sequences that are transmitted to the NVM memory block 110. The RAID module 216 generates RAID parity and recovery of failed data. The RAID parity can be used to provide an additional level of integrity protection for data written into the NVM memory block 110. In some embodiments, the ECC engine 212 implements the functions of the RAID module 216.

The example module 204 also includes a memory interface 218 that provides the command sequences to the NVM memory block 110 and receives status information from the NVM memory block 110. For example, the memory interface 218 implements any known or after developed communication protocol including a double data rate (DDR) interface, such as a Toggle Mode 200, 400, or 800 interface. The module 204 also includes a flash control layer 220 that controls the overall operation of the module 204.

Still referring to example modules within the controller 104 in FIG. 2A, additional modules within the controller 104 includes a dummy word line (DW) pattern generation module 222, a DW error analysis module 224, and a read parameter adjustment module 226. Dummy word lines are placed on non-volatile memory die that are used for the purposes of analyzing and tracking behavior and health of a respective non-volatile memory die. In various embodiments, the DW pattern generation module 222 puts a known data pattern into a dummy word line and tracks or periodically check for errors by reading the data back out of the dummy word line and comparing the data to the known data pattern.

In various embodiments, the read parameter adjustment module 226 adjusts parameters associated with a particular non-volatile memory die. For example—and as discussed further below—the read parameters adjustment module 226 can adjust parameters associated with a particular non-volatile memory die during an operation (e.g., a read or write) to adjust or re-adjust the read parameters. During the operation to re-adjust the read parameters, the read parameter adjustment module 226 adjusts the read parameters for a particular memory block, reads data out of the memory block, and verifies a resulting BER. If the resulting BER falls at or below a target or expected BER, the read parameters adjustment module 226 stores the read parameters for the memory block. Subsequently, the stored read parameters are used during a read of any word line within the memory block. Thus, read parameters can be unique to a memory block.

Additional modules within the example controller 104 include a buffer manager/bus controller 228 that manages, for example, buffers in the RAM 230 and controls the internal bus arbitration of the bus 206 in the controller 104. Additionally, or alternatively, the controller 104 can include a media management layer 236 that performs wear leveling of the NVM memory block 110. As previously mentioned, the various modules described with respect to the controller 104 are not meant to be limiting as to the architecture of the controller 104. For example, the physical layer interface 210, the RAID module 216, the media management layer 236, and the buffer management/bus controller 228 can be examples of optional components within the controller 104.

Furthermore, in embodiments where the storage system 102 includes flash memory, the media management layer 236 can be integrated as part of the flash management that handles flash error and interfaces with the host 106. In particular, the media management layer 236 can include an algorithm (e.g., firmware in the memory device), that translates a write command received from the host 106 into a write to the NVM memory block 110.

Figure 2B:
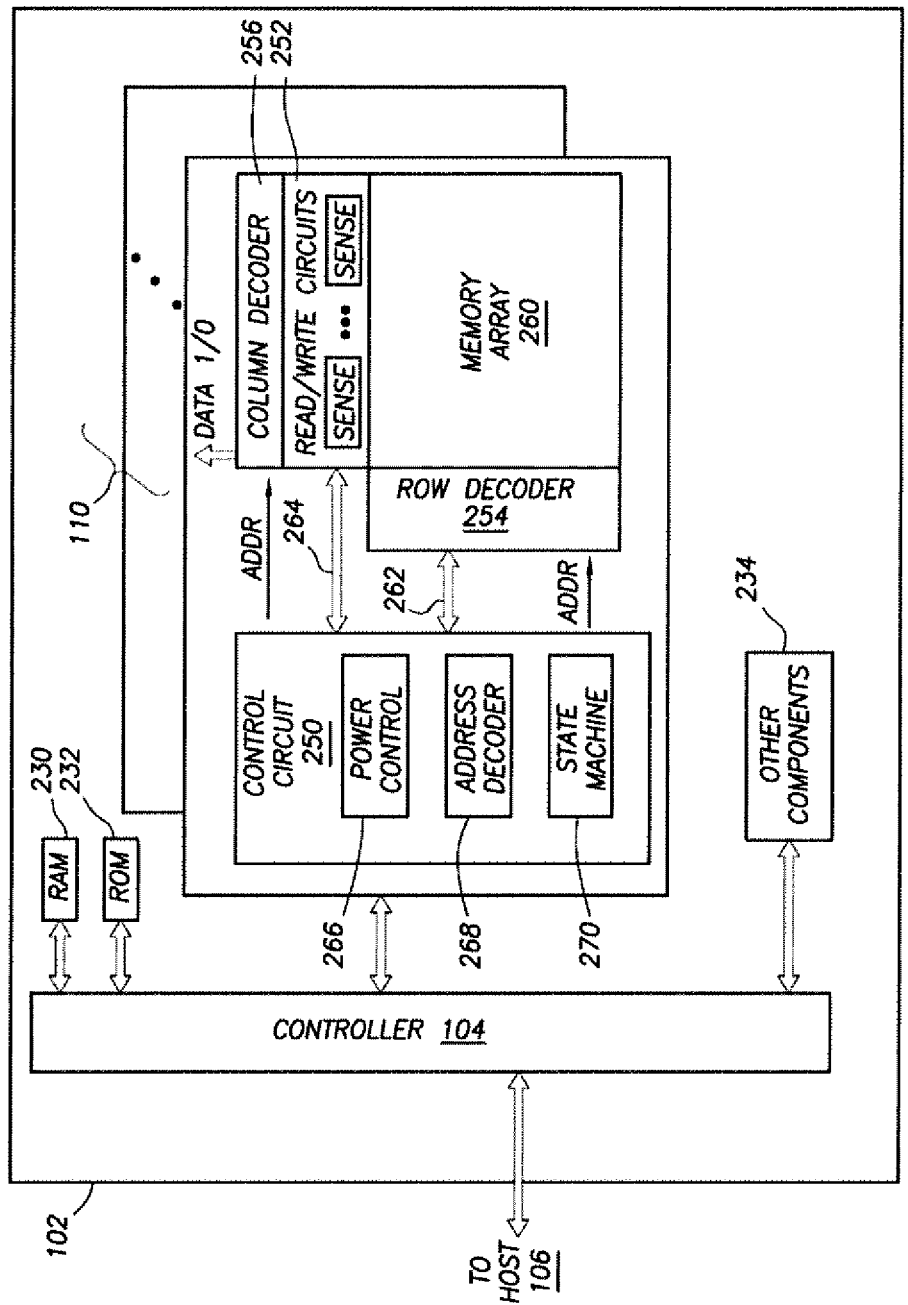
FIG. 2B generally illustrates a block diagram of example components of a non-volatile memory storage system according to the principles of the present disclosure.

FIG. 2B generally illustrates a block diagram with various features of the NVM memory block 110 within the storage system 102. As details of the controller 104 have been previously described (in FIG. 2A), in FIG. 2B the controller 104 is illustrated as a single block. Additionally, previously described RAM 230, the ROM 232, and the other components 234 are included in FIG. 2B to help orient the reader. Next, details within an example memory die 110-1 are discussed. Although the discussion centers on the memory die 110-1, each of the features discussed in relation to the memory die 110-1 equally applies to all of the memory dies within NVM memory block 110.

In some embodiments, the example memory die 110-1 includes control circuit 250, read/write circuits 252, a row decoder 254, a column decoder 256, and a memory array 260. The memory array 260 can include a two-dimensional array or a three-dimensional array of memory cells. The read/write circuits 252 read and program pages of memory within the memory die 110-1, in parallel. In various embodiments, the memory array 260 is accessed by word lines via the row decoder 254 and by bit lines via the column decoder 256.

The architecture of the memory die 110-1 is not meant to be limiting and any known architecture that can perform the functions of accessing the memory array 260 can be used without departing from the scope of this disclosure. For example, in various embodiments, access to the memory array 260 by various peripheral circuits can be implemented in a symmetric fashion on opposite sides of the memory array 260, which reduces the densities of access lines, and circuitry on each side of the memory array 260.

Still referring to FIG. 2B, in various embodiments, the example control circuit 250 includes a power control circuit 266, an address decoder 268, and a state machine 270. In some embodiments, the power control circuit 266, the address decoder 268, and the state machine 270 can be collectively referred to as managing circuits. The control circuit 250 and its various managing circuits are communicatively coupled by various interfaces (e.g., interfaces 262 and 264) to the row decoder 254 and the column decoder 256. In various embodiments, the control circuit 250 performs various operations on the memory array 260 that include reading or writing to the memory cells.

The power control circuit 266 controls the power and voltage supplied to the word lines and bit lines during operation of the memory array 260. The address decoder 268 provides an address interface that translates addresses between addresses provided by the host 106 and addresses used by the row decoder 254 and the column decoder 256. The example address decoder 268 converts an address provided by the host 106 to an address that is understood and compatible with a format used by the row decoder 254 and the column decoder 256. The state machine 270 provides chip-level control of memory operations.

Thus, the storage system 102 includes various components including the controller 104 and the NVM memory block 110, details of which have been described above in FIGS. 1A, 1B, 2A, and 2B. The discussion now turns to an example architecture of an example memory array 260 and in particular methods that can be performed to improve a performance of a read in the storage system 102.

Figure 3:
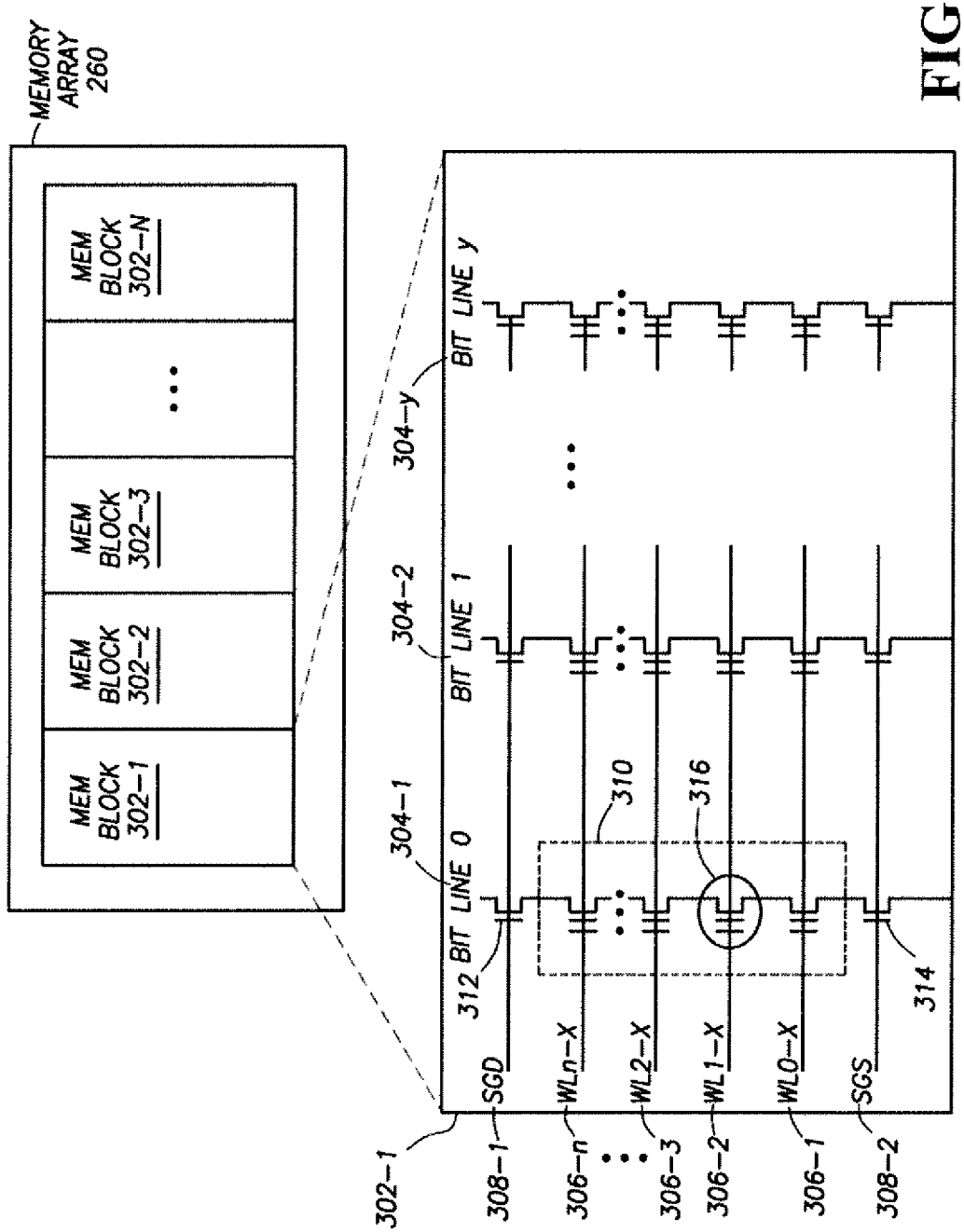
FIG. 3 generally illustrates a memory block according to the principles of the present disclosure.

FIG. 3 further illustrates the memory array 260. The memory array 260 is divided into several memory blocks 302. In flash memory, a memory block is defined as a unit of erase. That is, each memory block 302 includes a number of memory cells that are erased together or as a block. In some embodiments, the memory array 260 can be partitioned into any number of blocks, for example, the memory array 260 includes 1,024 blocks. Additionally, or alternatively, each of the memory blocks 302 can conceptually be divided into a number of pages defined as a unit of programming. In some embodiments, a page of data can be stored in one row of memory cells. Each page can include user data and overhead data, where the overhead data includes CC that has been calculated from the user data. In some embodiments, the memory blocks 302-1 to 302-N may include solid-state NAND memory blocks.

Each memory block 302, for example memory block 302-1, includes multiple bit lines 304, word lines 306, and select lines 308. Each bit line, for example bit line 304-1, is connected to several memory cells connected in series. More particularly, in an embodiment where each memory cell is a floating gate transistor, the floating gate transistors are connected in series to form a NAND string 310 (e.g., illustrated within the dashed box). Although four memory cells are shown in FIG. 3, the number of memory cells within the NAND string is not meant to be limiting. For example, 16, 32, 64, 128, or any other number of memory cells can be connected in a NAND string. Each respective bit line 304 is coupled to a respective NAND string within the block 302.

Still referring to FIG. 3, a method of reading data stored in a particular memory cell (e.g., memory cell 316) includes applying a voltage to the select lines 308 of the block 302, which in turn are coupled to respective NAND strings within the block 302, including the NAND string 310 the includes the memory cell 316. The voltage applied to the select lines 308 is greater than threshold voltages of the select transistors 312 and 314. The select transistor 312 is controlled by the select gate drain line (SGD) 308-1 and the select transistor 314 is controlled by the select gate source line (SGS) 308-2. Additionally, in order to read data in the memory cell 316, all other memory cells or unselected memory cells in the NAND string 310 are turned on (e.g., conducting current regardless of whether they are programmed or erased). The unselected memory cells have a read pass voltage (e.g., read parameters) applied to their respective word lines that turn on the unselected memory cells.

During the example read operation, various read compare levels (e.g., voltages) are applied to the word line 306-2 to determine the value stored in the memory cell 316. In some embodiments, the conduction current of the memory cell 316 is measured to determine the value stored within the memory cell 316. The method in which each memory cell is accessed and the number of memory cells accessed during a read or write varies. For example, all of the bit lines of the memory block 302-1 can be simultaneously programmed or read. In various embodiments, memory cells along a shared word line can be programmed at the same time (e.g., concurrently). In other embodiments, the bit lines can be divided into even bit lines and odd bit lines. In an odd/even bit line architecture, memory cells along a shared word line and connected to the odd bit lines are programmed at one time, while memory cells along a shared word line and connected to an even bit line are programmed at a different time.

Each time data is written to a memory block the data is processed by the ECC engine 212 which includes encoding the data (e.g., using a particular error correction code) and storing the encoded data in the memory block. When the data is read back out of the memory block, the data is processed by the ECC engine 212 which includes decoding the data, correcting errors (e.g., tracked as the BER), and returning the data to a user (by way of the controller 104). In some embodiments, the amount of time the ECC engine 212 takes to return data to the controller 104 is defined as the throughput time.

In some embodiments, the controller 104 performs data consolidation operations on the memory array 260. The controller 104 selects a source block from the memory block 302-1 to memory block 302-N of the memory array 260, for a consolidation or compaction. For example, the controller 104 may select memory block 302-1 as the source block for consolidation or compaction. The memory block 302-1 may be referred to as the source block 302-1 throughout the example embodiments described herein. The source block 302-1 may include a plurality of memory fragments, such as 16 memory fragments or any suitable number of memory fragments. The memory fragments may include data written by the host 106 during a host write operation. The memory fragments may belong to respective logical groups and may be scattered or disorganized in the source block 302-1, such that memory fragments associated with the same logical group may not be sequentially stored or organized in the source block 302-1. Additionally, or alternatively, while some memory fragments include data written by the host 106 during a host write operation, other memory fragments scattered throughout the source block 302-1 may be blank (e.g., having been erased by the host 106 or the controller 104 or having not been written to by the host 106).

In some embodiments, the storage system 102 may include one or more charge pumps that generate voltages used by the controller 104 to perform operations, such as erase operations, programming operations, write operations, read operations, and the like on one or more memory cells of the memory blocks 302-1 to 302-N. The charge pump may increase or decrease a supply voltage and provide voltage pulses (e.g., using the increased or decreased voltage) to the memory cells. For example, the charge pump may double the voltage from the supply voltage, triple the voltage from the supply voltage, half the voltage from the supply voltage, or increase or decrease the voltage from the supply voltage to any suitable factor of the supply voltage in order to generate voltage pulses at a voltage required for performing operations the memory cells.

In some embodiments, the charge pump is connected to one or more capacitors. For example, the charge pump may be connected to the one or more capacitors in parallel or series. In some embodiments, the charge pump may be connected to some capacitors in parallel and some capacitors in series. During a first pulse of the charge pump operation, the charge pump, using the supply voltage, may charge the one or more capacitors (e.g., bringing the capacitor to the same voltage as the supply voltage). The charge pump may include or be connected to a suitable switching device.

The charge pump may use the switching device to reconfigure the connection between the charge pump and the one or more capacitors, which may change the way the one or more capacitors are connected to the charge pump (e.g., from series to parallel, parallel to series, or a combination thereof). During a second pulse of the charge pump, the charge pump may supply voltage from the voltage supply to the one or more capacitors (e.g., being charged to the voltage of the voltage supply) which may double the voltage at the one or more capacitors. It should be understood that the charge pump may be connected to any number of capacitors in any suitable fashion and may use the supply voltage and the switching device to charge the capacitors to any suitable voltage. Additionally, or alternatively, the charge pump may use any number of pulses to charge the capacitors. The controller 104 may use the voltage stored in the capacitors by the charge pump to program the memory cells.

In some embodiments, the controller 104 may be configured to reduce program operation time while performing a verification operation during performance of the program operation. For example, as described, the controller 104 may program or write data to memory cells of the storage system 102. The controller 104 may program memory cells of a plurality of memory cells, such as the memory cells 316, of a memory block, such as the memory block 302. As described, the memory block 302 may include one or more memory strings 310. Each memory string 310 corresponds to a plurality of memory cells of the memory cells 316. The memory cells 316, as described, may include single level cells (e.g., having one bit for each memory cell 316), multiple level cells (e.g., having two bits for each memory cell 316), triple level cells (e.g., having three bits for each memory cell 316), quad level cells (e.g., having four bits for each memory cell 316), or any other suitable type of memory cell.

During performance of the program operation, the controller 104 may program the memory cells 316 of a respective memory string 310, which may be referred to as a program loop. In order to improve performance of the storage system 102, the controller 104 may perform the fast verification operation, as described, after each program loop. For example, the controller 104 may perform a program or write verification operation on memory strings 310 after a completion of corresponding program loops.

In some embodiments, during performance of the program operation, the controller 104 may identify a first memory string 310. The first memory string 310 may include a memory string of the memory strings 310 that is programmed first (e.g., before the other memory strings 310) during performance of the program operation. The controller 104 may be configured to skip performance of a portion of the verification operation on the first memory string 310. The portion of the verification operation may include applying the read verification voltage, as described. The controller 104, during performance of the verification operation, may skip application of the read verification voltage on the first memory string 310 while continuing to perform other portions or steps of the verification operation on the first memory string 310.

The controller 104 may disable the portion of verification on the first memory string 310. For example, the controller 104 may set a flag indicating that the portion of program (e.g., write) verification is disabled for the first memory string 310. Additionally, or alternatively, the controller 104 may set one or more bits in the first memory string 310 to a value indicative of the portion of verification being disabled for the first memory string 310.

In some embodiments, the controller 104 may receive instructions to skip the portion of the verification operation on the first memory string 310. For example, the controller 04 may receive instructions from the host 106, or any suitable source instructing the controller 104 to skip the portion of the verification operation on the first memory string 310 after completion of the program loop corresponding to the first memory string 310. It should be understood that, while only limited examples are described herein, the controller 104 may disable the portion of the verification operation for the first memory string 310 in any suitable manner other than those described herein, receive instructions from any suitable source other than those described herein to skip performance of the portion of the verification operation on the first memory string 310, receive instructions from any suitable source other than those described herein instructing the controller 104 to disable the portion of the verification operation for the first memory string 310, and/or determine, in any suitable manner, to skip or disable the portion of the verification operation for the first memory string 310.

In some embodiments, during performance of the program operation, the controller 104 may identify other (e.g., subsequent) memory strings 310. The other memory strings 310 may include memory strings 310 that are programmed after the first memory string 310 during performance of the program operation. The controller 104 may be configured to perform the verification operation, including the portion of the verification operation, on the other memory strings 310. The controller 104 may enable the portion of verification on the other memory strings 310 (e.g., enable normal verification). For example, the controller 104 may set a flag indicating that program (e.g., write) verification is enabled for the other memory strings 310. Additionally, or alternatively, the controller 104 may set one or more bits in the respective ones of the other memory strings 310 to a value indicative of verification being enabled for the other memory strings 310.

In some embodiments, the controller 104 may set one or more bits on a second memory string 310. The second memory string 310 may include the memory string of the memory strings 310 programmed immediately after or subsequent to the first memory string 310 during performance of the program operation. The controller 104 may perform the verification operation, including the portion of the verification operation, on the other memory strings 310 in response to determining that the one or more bits of the second memory string 310 indicates that the verification is enabled for the other memory strings 310.

In some embodiments, the controller 104 may receive instructions to perform the verification operation on the other memory strings 310. For example, the controller 04 may receive instructions from the host 106, or any suitable source instructing the controller 104 to perform the verification operation on the other memory strings 310 after completion of program loops corresponding to the respective ones of the other memory strings 310. It should be understood that, while only limited examples are described herein, the controller 104 may enable the verification operation for the other memory strings 310 in any suitable manner other than those described herein, receive instructions from any suitable source other than those described herein to perform the verification operation on the other memory strings 310, receive instructions from any suitable source other than those described herein instructing the controller 104 to enable the verification operation for the other memory strings 310, and/or determine, in any suitable manner, to perform the verification operation for the other memory strings 310.

The controller 104 may be configured to perform the portion of the program (e.g., write) verification on the other memory strings 310 (e.g., skipping the first memory string 310). For example, the controller 104 may apply a read verification voltage to respective ones of the other memory strings 310 after completion of corresponding program loops. The controller 104 may verify that the expected data (e.g., data programmed or written during performance of the program operation) is stored in respective memory cells 316 using the read verification voltage.

In some embodiments, during performance of the program operation, the controller 104 may be configured to skip performance of a portion of the verification operation on the all of the memory strings 310. As described, the portion of the verification operation may include applying the read verification voltage. The controller 104, during performance of the verification operation, may skip application of the read verification voltage on the first memory string 310 and any subsequent memory string 310 while continuing to perform other portions or steps of the verification operation on the first memory string 310 and all subsequent memory strings 310.

The controller 104 may disable the portion of verification on each of the memory strings 310. For example, the controller 104 may set a flag indicating that the portion of program (e.g., write) verification is disabled for the memory strings 310. Additionally, or alternatively, the controller 104 may set one or more bits in each of the memory strings 310 to a value indicative of the portion of verification being disabled for the memory strings 310.

In some embodiments, the controller 104 may receive instructions to skip the portion of the verification operation on the memory strings 310. For example, the controller 04 may receive instructions from the host 106, or any suitable source instructing the controller 104 to skip the portion of the verification operation on a respective memory string 310 after completion of the program loop corresponding to the respective memory string 310. In some embodiments, the controller 104 may receive instructions to skip the portion of the verification operation on all of the memory strings 310. It should be understood that, while only limited examples are described herein, the controller 104 may disable the portion of the verification operation for the memory strings 310 in any suitable manner other than those described herein, receive instructions from any suitable source other than those described herein to skip performance of the portion of the verification operation on the memory strings 310, receive instructions from any suitable source other than those described herein instructing the controller 104 to disable the portion of the verification operation for the memory strings 310, and/or determine, in any suitable manner, to skip or disable the portion of the verification operation for the memory strings 310. Additionally, or alternatively, the controller 104 may be configured to skip the portion of the verification operation on any suitable subset of the memory strings 31, other than those described herein.

In some embodiments, the controller 104 may perform the methods described herein. However, the methods described herein as performed by the controller 104 are not meant to be limiting, and any type of software executed on a controller can perform the methods described herein without departing from the scope of this disclosure. For example, a controller such as a processor executing software within the host 106 or firmware within the storage system 102 (e.g., stored on ROM 232 or NVM memory block 110) can perform the methods described herein.

Figure 5:
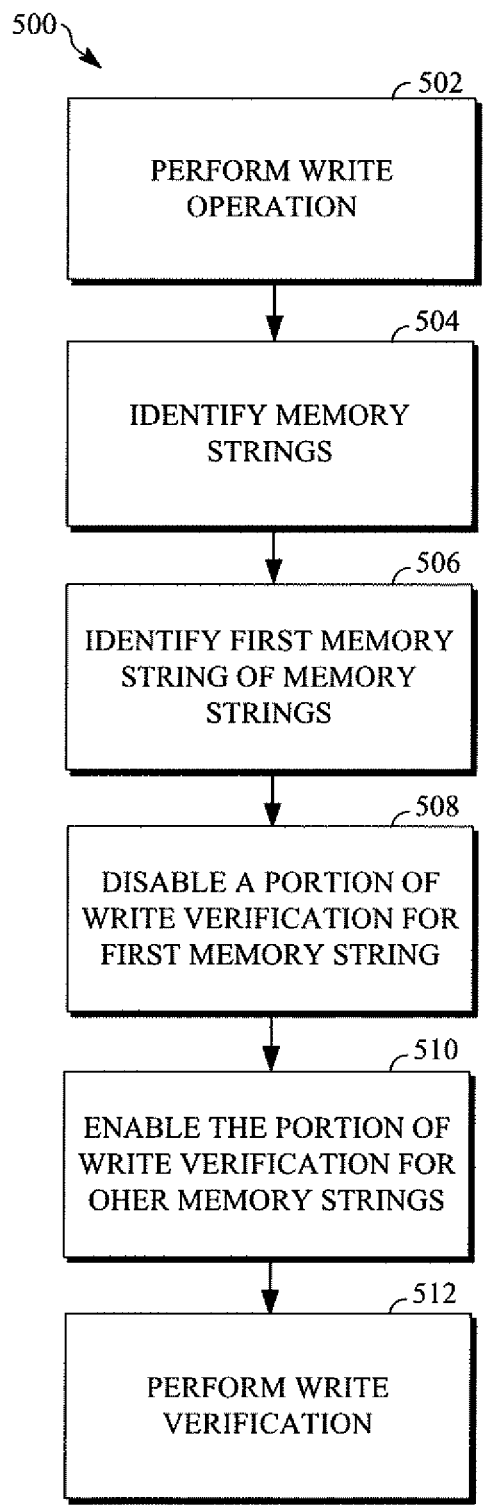
FIG. 5 is a flow diagram illustrating a memory program verification method according to the principles of the present disclosure.

FIG. 5 is a flow diagram illustrating a memory program verification method 500 according to the principles of the present disclosure. At 502, the method 500 performs a write operation. For example, the controller 104 performs the program (e.g., write) operation on memory cells 316 of the memory block 302, or any suitable memory block or memory device of the storage system 102.

At 504, the method 500 identifies memory strings. For example, the controller 104 may identify memory strings 310 associated with respective memory cells 316. The controller 104 may identify memory strings 310 to be programmed during performance of the program operation. Additionally, or alternatively, the controller 104 may receive instructions, from the host 106 or other suitable source, identifying the memory strings 310 (e.g., and the corresponding memory cells 316) to be programmed during performance of the program operation.

At 506, the method 500 identifies a first memory string of the memory strings. For example, the controller 104 identifies the first memory string 310 of the memory strings 310. The first memory string 310 may include the memory string 310 programmed first during performance of the program operation.

At 508, the method 500 disables at least a portion of a write verification for the first memory string. For example, the controller 104 may disable at least a portion of the verification for the first memory string 310, as described. For example, the controller 104 disables application of the read verification voltage on the first memory string. At 510, the method 500 enables the portion of the write verification for other memory strings. For example, the controller 104 enables verification for the other memory strings 310, as described.

At 512, the method 500 performs the write verification. For example, the controller 104 performs the verification operation on memory strings 310. The controller 104 performs the portion of the write verification on memory strings 310 having the portion of the write verification enabled. Conversely, the controller 104 does not perform the portion of the write verification on the memory strings 310 having the portion of the write verification disabled (e.g., the first memory string 310). For example, the controller 104 does not apply the read verification voltage to the first memory string 310 and applies the read verification voltage to the other memory strings 310 (e.g., the memory strings 310 having the portion of the write verification enabled). The controller 104 verifies that the expected data was programmed (e.g., written or stored) to respective memory cells 316 using the read verification voltage.

Figure 6:
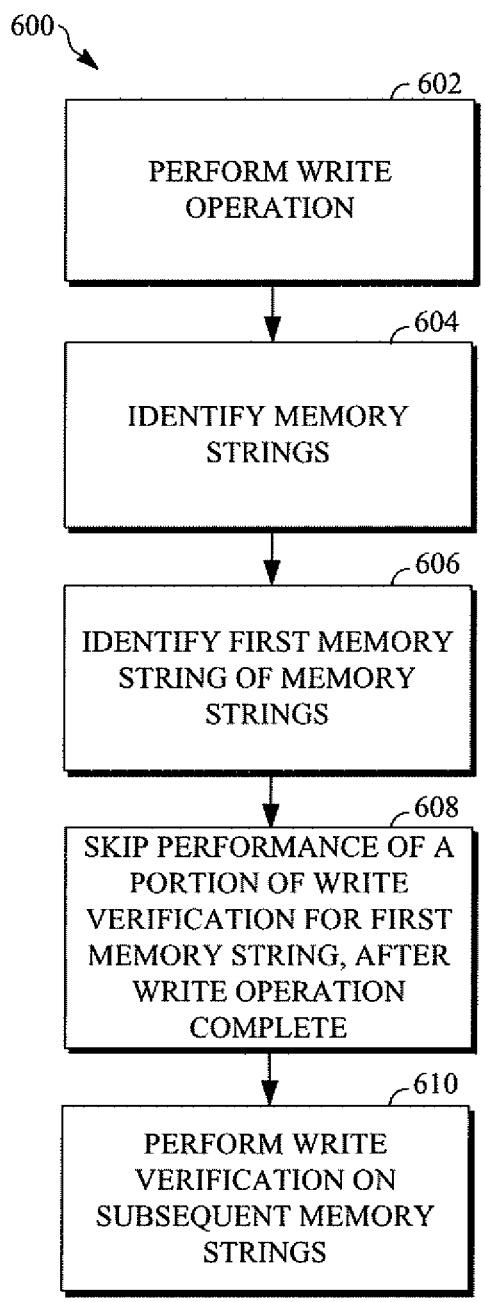
FIG. 6 is a flow diagram illustrating an alternative memory program verification method according to the principles of the present disclosure.

FIG. 6 is a flow diagram illustrating an alternative memory program verification method 600 according to the principles of the present disclosure. At 602, the method 600 performs a write operation. For example, the controller 104 performs the program (e.g., write) operation on memory cells 316 of the memory block 302, or any suitable memory block or memory device of the storage system 102.

At 604, the method 600 identifies memory strings. For example, the controller 104 may identify memory strings 310 associated with respective memory cells 316. The controller 104 may identify memory strings 310 to be programmed during performance of the program operation. Additionally, or alternatively, the controller 104 may receive instructions, from the host 106 or other suitable source, identifying the memory strings 310 (e.g., and the corresponding memory cells 316) to be programmed during performance of the program operation.

At 606, the method 600 identifies a first memory string of the memory strings. For example, the controller 104 identifies the first memory string 310 of the memory strings 310. The first memory string 310 may include the memory string 310 programmed first during performance of the program operation.

At 608, the method 600 skips performance of the at least a portion of a write verification for the first memory string after the write operation is complete. For example, the controller 104 determines that a program loop of the program operation corresponding the first memory string 310 is complete. In response to determining that the program loop (e.g., programming of the first memory string 310) is complete, the controller 104 skips performance of the portion of the verification operation on the first memory string 310 (e.g., the controller 104 skips application of the read verification voltage on the first memory string 310). The controller 104 may perform other steps or portions of the verification operation on the first memory string 310.

At 612, the method 600 performs the write verification on subsequent memory strings. For example, the controller 104 determines that the program loop for a respective memory string 310 of the other memory strings 310 is complete. The controller 104 performs the verification operation on the respective memory string 310. The controller 104 applies the read verification voltage to the respective memory string 310 and all other verification steps or portions of the verification operation. The controller 104 verifies that the expected data was programmed (e.g., written or stored) to corresponding memory cells 316 of the respective memory string 310 using the read verification voltage. The controller 104 continues to perform the verification operation on the other memory strings 310 (e.g., the memory strings 310 that are programmed subsequent to the first memory string 310 during performance of the program operation) upon completion of respective program loops.

Figure 7:
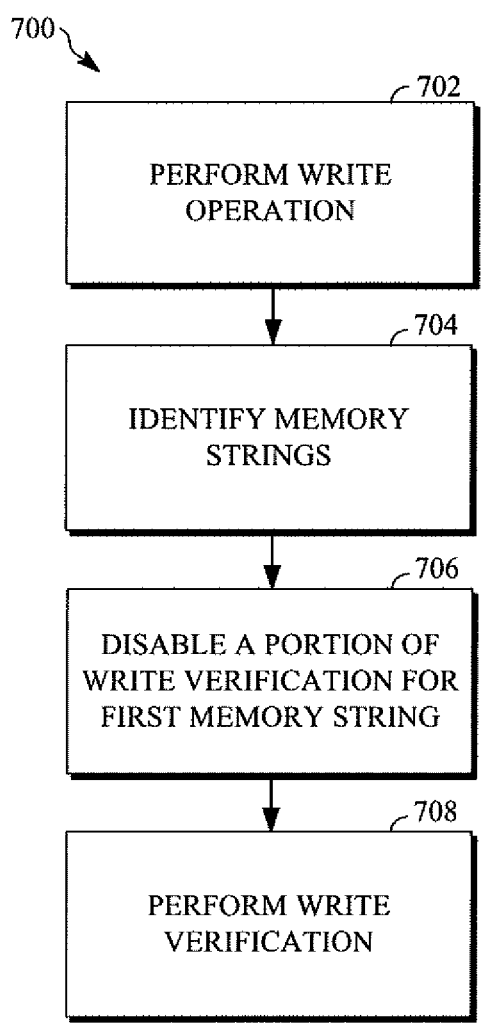
FIG. 7 is a flow diagram illustrating an alternative memory program verification method according to the principles of the present disclosure.

FIG. 7 is a flow diagram illustrating an alternative memory program verification method 700 according to the principles of the present disclosure. At 702, the method 700 performs a write operation. For example, the controller 104 performs the program (e.g., write) operation on memory cells 316 of the memory block 302, or any suitable memory block or memory device of the storage system 102.

At 704, the method 700 identifies memory strings. For example, the controller 104 may identify memory strings 310 associated with respective memory cells 316. The controller 104 may identify memory strings 310 to be programmed during performance of the program operation. Additionally, or alternatively, the controller 104 may receive instructions, from the host 106 or other suitable source, identifying the memory strings 310 (e.g., and the corresponding memory cells 316) to be programmed during performance of the program operation.

At 706, the method 700 disables a portion of the write verification for of the memory strings. For example, the controller 104 may receive instructions not to perform the portion of the verification operation on the memory strings 310. The controller 104 may disable at least a portion of the verification for the memory strings 310. For example, the controller 104 disables application of the read verification voltage on the memory strings 310.

At 712, the method 700 performs the write verification. For example, the controller 104 performs the verification operation on memory strings 310, skipping the portion of the verification operation. For example, the controller 104 may not apply the read voltage verification voltage to the memory strings 310.

Figure 8:
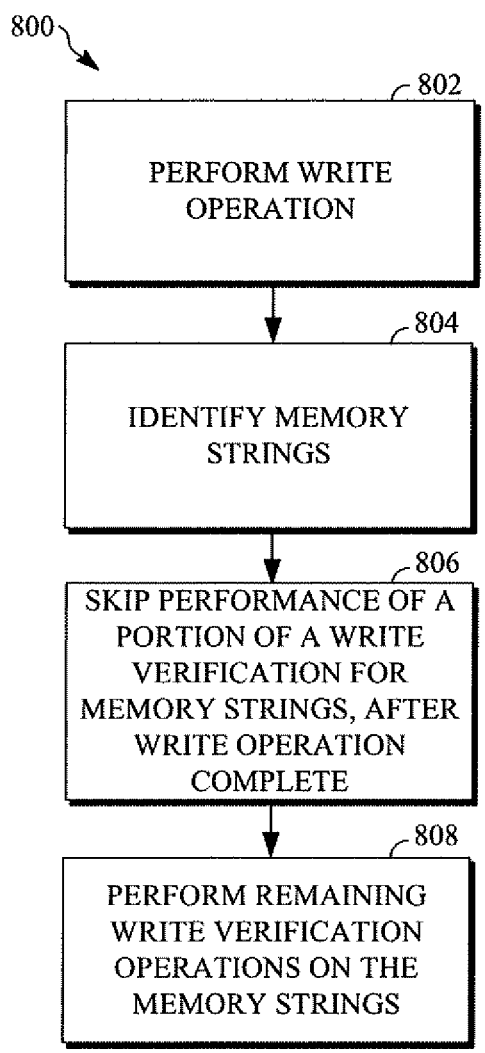
FIG. 8 is a flow diagram illustrating an alternative memory program verification method according to the principles of the present disclosure.

FIG. 8 is a flow diagram illustrating an alternative memory program verification method 800 according to the principles of the present disclosure. At 802, the method 800 performs a write operation. For example, the controller 104 performs the program (e.g., write) operation on memory cells 316 of the memory block 302, or any suitable memory block or memory device of the storage system 102.

At 804, the method 800 identifies memory strings. For example, the controller 104 may identify memory strings 310 associated with respective memory cells 316. The controller 104 may identify memory strings 310 to be programmed during performance of the program operation. Additionally, or alternatively, the controller 104 may receive instructions, from the host 106 or other suitable source, identifying the memory strings 310 (e.g., and the corresponding memory cells 316) to be programmed during performance of the program operation.

At 806, the method 800 skips performance of at least a portion of the write verification for the memory strings after the write operation is complete. For example, the controller 104 determines that a program loop of the program operation corresponding the first memory string 310 is complete. In response to determining that the program loop (e.g., programming of the first memory string 310) is complete, the controller 104 skips performance of the portion of the verification operation on the first memory string 310 (e.g., the controller 104 skips application of the read verification voltage on the first memory string 310). The controller 104 continues to determine, for the other memory strings 310, that respective program loops of the program operation corresponding to respective memory string 310 are complete. The controller 104 skips the portion of the verification operation on the other memory strings 310.

At 808, the method 800 performs the remaining write verification operations on the memory strings. For example, the controller 104 may perform other steps or portions of the verification operation on the memory strings 310.

In some embodiments, a method for memory program verification includes performing a write operation on memory cells of a memory device. The method also includes identifying memory strings associated with respective memory cells of the memory cells. The method also includes identifying a first memory string of the memory strings. The method also includes disabling a write verification for the first memory string. The method also includes enabling the write verification for other memory strings of the memory strings. The method also includes performing a write verification operation on write verification enabled memory strings.

In some embodiments, the first memory string includes a memory string programmed first during performance of the write operation. In some embodiments, performing the write verification operation includes applying a verification voltage (e.g., causing the verification voltage spike) to the write verification enabled memory strings. In some embodiments, performing the write verification operation includes equalizing channel potential of the memory device. In some embodiments, the memory device includes a single level cell memory device. In some embodiments, the memory device includes a multiple level cell memory device. In some embodiments, the memory device includes a triple level cell memory device. In some embodiments, the memory device includes a quad level cell memory device.

In some embodiments, a controller includes a bus interface and a processor. The bus interface is in communication with at least one memory block of a memory device. The processor is configured to: perform a write operation on memory cells of the at least one memory block; identify memory strings associated with respective memory cells of the memory cells; identify a first memory string of the memory strings; disable a write verification for the first memory string; enable the write verification for other memory strings of the memory strings; and perform a write verification operation on write verification enabled memory strings.

In some embodiments, the first memory string includes a memory string programmed first during performance of the write operation. In some embodiments, the instructions further cause the processor to perform the write verification operation by applying a verification voltage (e.g., causing the verification voltage spike) to the write verification enabled memory strings. In some embodiments, the memory cells include one bit. In some embodiments, the memory cells include two bits. In some embodiments, the memory cells include three bits. In some embodiments, the memory cells include four bits.

In some embodiments, a method for memory program verification includes performing a write operation on memory cells of a memory device. The method also includes identifying memory strings associated with respective memory cells of the memory cells. The method also includes identifying a first memory string of the memory strings, the first memory string including a memory string of the memory strings to be programmed first during performance of the write operation. The method also includes, in response to completion of performance of the write operation on the first memory string, skipping performance of a write verification operation on the first memory string. The method also includes performing, in response to completion of performance of the write operation on subsequently programmed memory strings, the write verification operation on the respective subsequently programmed memory strings of the memory strings.

In some embodiments, the memory device includes a single level cell memory device. In some embodiments, the memory device includes a multiple level cell memory device. In some embodiments, the memory device includes a triple level cell memory device. In some embodiments, the memory device includes a quad level cell memory device.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications. In the preceding description and in the claims, the terms "including" and "comprising" are used in an open-ended fashion, and thus should be interpreted to mean "including, but not limited to . . . ." In addition, the term "couple" or "couples" is intended to mean either an indirect or a direct connection. Thus, if a first device couples to a second device, that connection may be through a direct connection or through an indirect connection via other devices and connections.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module. In some embodiments, the controller 104 is implemented within the host 106 can be configured with hardware and/or firmware to perform the various functions described herein.

"Controller" shall mean individual circuit components, an application-specific integrated circuit (ASIC), a microcontroller with controlling software, a digital signal processor (DSP), a processor with controlling software, a field programmable gate array (FPGA), or combinations thereof.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present invention and do not limit the present invention. On the contrary, the invention is intended to cover various modifications and equivalent arrangements included within the scope of the appended claims, which scope is to be accorded the broadest interpretation to encompass all such modifications and equivalent structure as is permitted under the law.

What is claimed is:

1. A method for memory program verification, the method comprising:
    performing a write operation on memory cells of a memory device;
    identifying memory strings associated with respective memory cells of the memory cells;
    identifying a first memory string of the memory strings;
    disabling a portion of a write verification for the first memory string, the portion of the write verification causing a verification voltage spike;
    enabling the portion of the write verification for other memory strings of the memory strings; and
    performing at least the portion of the write verification operation on memory strings having the portion of the write verification enabled.

2. The method of claim 1, wherein the first memory string includes a memory string programmed first during performance of the write operation.

3. The method of claim 1, wherein performing at least the portion of the write verification operation includes:
    applying the verification voltage spike to the memory strings having the portion of the write verification enabled; and
    skipping application of the verification voltage spike to the first memory string.

4. The method of claim 1, wherein performing the portion of the write verification operation includes equalizing channel potential of the memory device.

5. The method of claim 1, wherein the memory device includes a single level cell memory device.

6. The method of claim 1, wherein the memory device includes a multiple level cell memory device.

7. The method of claim 1, wherein the memory device includes a triple level cell memory device.

8. The method of claim 1, wherein the memory device includes a quad level cell memory device.

9. A controller comprising:
    a bus interface in communication with at least one memory block of a memory device; and
    a processor configured to:
        perform a write operation on memory cells of the at least one memory block;
        identify memory strings associated with respective memory cells of the memory cells;
        identify a first memory string of the memory strings;
        disable a portion of a write verification for the first memory string, the portion of the write verification causing a verification voltage spike;
        enable the portion of the write verification for other memory strings of the memory strings; and
        perform at least the portion of the write verification operation on memory strings having the portion of the write verification enabled.

10. The controller of claim 9, wherein the first memory string includes a memory string programmed first during performance of the write operation.

11. The controller of claim 9, wherein the instructions further cause the processor to perform at least the portion of the write verification operation by:
    applying the verification voltage spike to the memory strings having the portion of the write verification enabled, and
    skipping application of the verification voltage spike to the first memory string.

12. The controller of claim 9, wherein the memory cells include one bit.

13. The controller of claim 9, wherein the memory cells include two bits.

14. The controller of claim 9, wherein the memory cells include three bits.

15. The controller of claim 9, wherein the memory cells include four bits.

16. A method for memory program verification, the method comprising:
    performing a write operation on memory cells of a memory device;
    identifying memory strings associated with respective memory cells of the memory cells;
    identifying a first memory string of the memory strings, the first memory string including a memory string of the memory strings to be programmed first during performance of the write operation;
    in response to completion of performance of the write operation on the first memory string, skipping performance of a portion of a write verification operation on the first memory string, the portion of the write verification causing a verification voltage spike; and
    performing, in response to completion of performance of the write operation on subsequently programmed memory strings, at least the portion of the write verification operation on the respective subsequently programmed memory strings of the memory strings.

17. The method of claim 16, wherein the memory device includes a single level cell memory device.

18. The method of claim 16, wherein the memory device includes a multiple level cell memory device.

19. The method of claim 16, wherein the memory device includes a triple level cell memory device.

20. The method of claim 16, wherein the memory device includes a quad level cell memory device.

\* \* \* \* \*